United States Patent
Seshadri et al.

(10) Patent No.: US 10,629,489 B2
(45) Date of Patent: Apr. 21, 2020

(54) APPROACH TO PREVENT COLLAPSE OF HIGH ASPECT RATIO FIN STRUCTURES FOR VERTICAL TRANSPORT FIN FIELD EFFECT TRANSISTOR DEVICES

(71) Applicant: INTERNATIONAL BUSINESS MACHINES CORPORATION, Armonk, NY (US)

(72) Inventors: Indira Seshadri, Niskayuna, NY (US); Stuart A. Sieg, Albany, NY (US); Praveen Joseph, Albany, NY (US); Ekmini A. De Silva, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/139,932

(22) Filed: Sep. 24, 2018

(65) Prior Publication Data
US 2020/0098639 A1    Mar. 26, 2020

(51) Int. Cl.
*H01L 21/8234* (2006.01)
*H01L 21/3105* (2006.01)
(Continued)

(52) U.S. Cl.
CPC .. *H01L 21/823431* (2013.01); *H01L 21/0206* (2013.01); *H01L 21/0228* (2013.01);
(Continued)

(58) Field of Classification Search
CPC ....... H01L 21/823431; H01L 21/31051; H01L 21/0206; H01L 21/823487; H01L 21/02282; H01L 21/3081; H01L 21/02181; H01L 21/02118; H01L 21/02115; H01L 21/31058; H01L 21/0228; H01L 21/31111;
(Continued)

(56) References Cited

U.S. PATENT DOCUMENTS 7,078,298 B2   7/2006   Lee et al.
7,300,837 B2   11/2007  Chen et al.
(Continued)

OTHER PUBLICATIONS

Polito et al., "Template-Assisted Preparation of Micrometric Suspended Membrane Lattices of Photoluminescent and Non-Photoluminescent Polymers by Capillarity-Driven Solvent Evaporation: Application to Microtagging", Scientific Reports. Aug. 21, 2017. pp. 1-11.

*Primary Examiner* — Selim U Ahmed
(74) *Attorney, Agent, or Firm* — Tutunjian & Bitetto, P.C.; Vazken Alexanian

(57) ABSTRACT

A method of preventing the collapse of fin structures is provided. The method includes forming a plurality of vertical fins on a substrate, and a hard mask stack on each of the vertical fins. The method further includes forming a cover layer on the plurality of vertical fins and hard mask stacks, and reducing the height of the cover layer to expose an upper portion of each of the hard mask stacks. The method further includes forming a bracing layer on the reduced height cover layer and exposed portion of each of the hard mask stacks, and removing a portion of the bracing layer to expose a portion of the reduced height cover layer and form a bracing segment on the exposed portion of each of the hard mask stacks. The method further includes removing the reduced height cover layer.

20 Claims, 10 Drawing Sheets

(51) Int. Cl.
  *H01L 21/02*     (2006.01)
  *H01L 21/311*    (2006.01)
  *H01L 21/308*    (2006.01)

(52) U.S. Cl.
  CPC .. *H01L 21/02115* (2013.01); *H01L 21/02118* (2013.01); *H01L 21/02181* (2013.01); *H01L 21/02282* (2013.01); *H01L 21/3081* (2013.01); *H01L 21/31051* (2013.01); *H01L 21/31058* (2013.01); *H01L 21/31111* (2013.01); *H01L 21/31116* (2013.01); *H01L 21/823487* (2013.01); *H01L 21/02178* (2013.01); *H01L 21/02189* (2013.01)

(58) Field of Classification Search
  CPC ......... H01L 21/31116; H01L 21/02189; H01L 21/02178
  See application file for complete search history.

(56) References Cited

U.S. PATENT DOCUMENTS

| | | |
|---|---|---|
| 9,202,894 B1 | 12/2015 | Zang |
| 9,614,087 B1 | 4/2017 | Cheng et al. |
| 9,755,073 B1 | 9/2017 | Cheng et al. |
| 9,799,765 B1 | 10/2017 | Bergendahl et al. |
| 9,837,408 B1 | 12/2017 | Bi et al. |
| 2013/0280123 A1 | 10/2013 | Chen et al. |
| 2018/0005834 A1 | 1/2018 | Cheng et al. | ns
APPROACH TO PREVENT COLLAPSE OF HIGH ASPECT RATIO FIN STRUCTURES FOR VERTICAL TRANSPORT FIN FIELD EFFECT TRANSISTOR DEVICES

BACKGROUND

Technical Field

The present invention generally relates to vertical fin structures, and more particularly to vertical fin structures for fin field effect transistor (FinFET) devices.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of preventing the collapse of fin structures is provided. The method includes forming a plurality of vertical fins on a substrate, and a hard mask stack on each of the vertical fins. The method further includes forming a cover layer on the plurality of vertical fins and hard mask stacks, and reducing the height of the cover layer to expose an upper portion of each of the hard mask stacks. The method further includes forming a bracing layer on the reduced height cover layer and exposed portion of each of the hard mask stacks, and removing a portion of the bracing layer to expose a portion of the reduced height cover layer and form a bracing segment on the exposed portion of each of the hard mask stacks. The method further includes removing the reduced height cover layer.

In accordance with another embodiment of the present invention, a method of preventing the collapse of fin structures is provided. The method includes forming a plurality of vertical fins on a substrate, and a hard mask stack on each of the vertical fins. The method further includes forming a cover layer on the plurality of vertical fins and hard mask stacks, and reducing the height of the cover layer to expose an upper portion of each of the hard mask stacks. The method further includes forming a bracing layer on the reduced height cover layer and exposed portion of each of the hard mask stacks, and removing a portion of the bracing layer to expose a portion of the reduced height cover layer and form a bracing segment on the exposed portion of each of the hard mask stacks. The method further includes removing the reduced height cover layer. The method further includes exposing the plurality of vertical fins to a wet cleaning solution, and removing the bracing segment.

In accordance with yet another embodiment of the present invention, a method of preventing the collapse of fin structures is provided. The method includes forming a plurality of vertical fins on a substrate, and a hard mask stack on each of the vertical fins, wherein the hard mask stack includes a first dielectric material layer on each of the plurality of vertical fins, a second dielectric material layer on the first dielectric material layer, and a third dielectric material layer on the second dielectric material layer. The method further includes forming a bracing segment on each of the hard mask stacks, and exposing the plurality of vertical fins to a wet cleaning solution.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide an approach to avoiding the collapse of vertical fins during wet cleaning and drying processes by forming a support structure. Where vertical fins and the associated hardmasks have high aspect ratios (e.g., >10:1), the surface tension of even low surface energy solutions can cause the vertical fin structures to bend towards each other to the point that the hardmasks on adjacent vertical fins can touch. Such fin collapse can render devices unusable. To compensate for the forces acting on the vertical fins and hardmasks, a supporting structure can be formed on the hardmask to counteract otherwise unbalanced forces.

Embodiments of the present invention provide a rigid support structure formed on the hardmasks that resist bending forces that the vertical fins would experience during down-stream processing involving liquid rinsing and drying operations. The rigid support structure can bridge adjacent hardmasks, while leaving the vertical fins exposed for cleaning.

Embodiments of the present invention provide methods of forming a rigid support structure that spans a plurality of vertical fins to resist the surface tension effects of solutions. The methods can include forming wet strippable organic planarization layers (OPLs) and dry ashable organic planarization layers that can remain athwart the hardmasks.

Exemplary applications/uses to which the present invention can be applied include, but are not limited to: Semiconductor logic device architectures including FINFETs, Vertical FETs, and Gate all around and memory devices.

It is to be understood that aspects of the present invention will be described in terms of a given illustrative architecture; however, other architectures, structures, substrate materials and process features and steps can be varied within the scope of aspects of the present invention.

Figure 1:
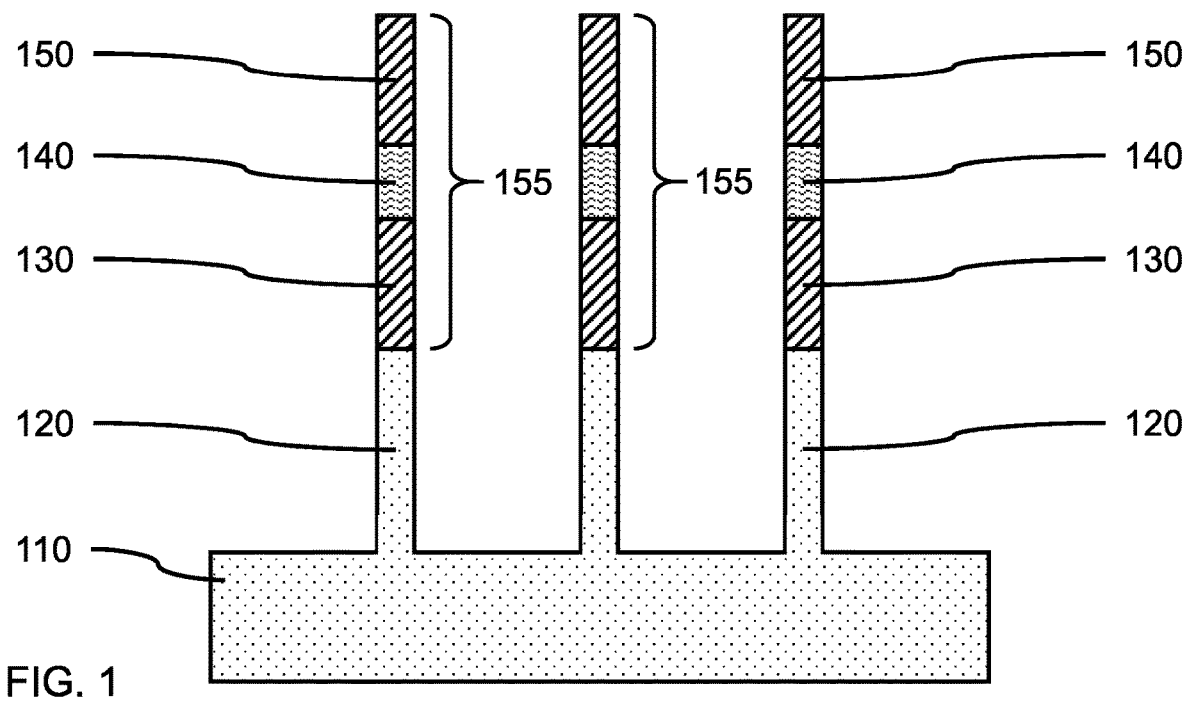
FIG. 1 is a cross-sectional side view showing a plurality of vertical fins on a substrate, and a hard mask stack on each of the vertical fins, in accordance with an embodiment of the present invention.

Referring now to the drawings in which like numerals represent the same or similar elements and initially to FIG. 1, a cross-sectional side view of a plurality of vertical fins on a substrate and a hard mask stack on each of the vertical fins is shown, in accordance with an embodiment of the present invention.

In one or more embodiments, one or more vertical fins 120 can be formed on a substrate 110. A hard mask stack 155 can be formed on each of the one or more vertical fins 120, where the hard mask stacks 155 and vertical fins 120 can be formed by an image transfer process, for example a sidewall image transfer (SIT) process, or a direct write process, for example, immersion lithography, extreme ultraviolet (EUV) lithography, or x-ray lithography. The sidewall image transfer (SIT) process can be a single or multiple patterning process, where the patterning process can be Self-Aligned Double Patterning (SADP), Self-Aligned Quadruple Patterning (SAQP), or Self-Aligned Triple Patterning (SATP).

In one or more embodiments, the hard mask stack 155 can include a first dielectric material layer 130 on the vertical fins 120, a second dielectric material layer 140 on the first dielectric material layer 130, and a third dielectric material layer 150 on the second dielectric material layer 140. In various embodiments, the first dielectric material layer 130 and third dielectric material layer 150 can be a nitride dielectric material, including, but not limited to, silicon nitride (SiN), silicon boronitride (SiBN), silicon carbonitride (SiCN), silicon boro carbonitride (SiBCN) and combinations thereof. In various embodiments, the second dielectric material layer 140 can be an oxide dielectric material, including, but not limited to, silicon oxide (SiO), silicon oxynitride (SiON), and combinations thereof. The second dielectric material layer 140 can be a different dielectric material layer from the first dielectric material layer 130 and third dielectric material layer 150, so the second dielectric material layer 140 can be selectively removed.

In one or more embodiments, the vertical fins 120 can be a semiconductor material, where the vertical fins can be formed from the substrate 110. In various embodiments, the vertical fins 120 can be a semiconductor material, including, but not limited to, silicon (Si), silicon-germanium (SiGe), germanium (Ge), and combinations thereof. The vertical fins 111 may include a dopant species.

In one or more embodiments, a substrate 110 can be, for example, a single crystal semiconductor material wafer or a semiconductor-on-insulator stacked wafer. The substrate 110 can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)) or a II-VI semiconductor (e.g., cadmium selenide (CdSe)).

In various embodiments, the vertical fin 120 and hard mask stack 155 can have a pitch in a range of about 20 nm to about 80 nm, or about 40 nm to about 60 nm, although other pitches are also contemplated.

In one or more embodiments, the vertical fins 120 can have a height in a range of about 50 nanometers (nm) to about 100 nm, or about 65 nm to about 85 nm, although other heights are also contemplated.

In one or more embodiments, the hard mask stack 155 can have a height in a range of about 50 nm to about 150 nm, or about 75 nm to about 125 nm, although other heights are also contemplated. The first dielectric material layer 130 can have a height in a range of about 40 nm to about 60 nm, or about 50 nm, although other heights are also contemplated. The second dielectric material layer 140 can have a height in a range of about 25 nm to about 50 nm, or about 35 nm, although other heights are also contemplated. The third dielectric material layer 150 can have a height in a range of about 40 nm to about 60 nm, or about 50 nm, although other heights are also contemplated. The height of the hard mask stack 155 can be greater than the height of the underlying vertical fin 120.

In one or more embodiments, the vertical fins 120, first dielectric material layer 130, second dielectric material layer 140, and third dielectric material layer 150 can have a width in a range of about 5 nm to about 12 nm, or about 7 nm to about 10 nm, although other widths are also contemplated. In various embodiments, the vertical fins 120 and hard mask stack 155 can have a high aspect ratio, where a high aspect ratio is equal to or greater than 10:1. In various embodiments, the aspect ratio of vertical fin 120 and hard mask stack 155 height to the width can be equal to or greater than 10:1, or equal to or greater than 15:1, or equal to or greater than 18:1. The high aspect ratio of the vertical fin and hard mask stack can increase the likelihood of fin collapse during wet cleaning processes after etching due to the surface tension of wet cleaning solutions. The wet cleaning solution can be a combination of deionized water (DI $H_2O$) and isopropyl alcohol (IPA), where the ratio of DI $H_2O$ to IPA can be selected to minimize the surface tension of the wet cleaning solution. The minimum surface tension of the wet cleaning solution can cause the vertical fins 120 to incline towards each other, where the vertical fins 120 can touch during drying.

Figure 2:
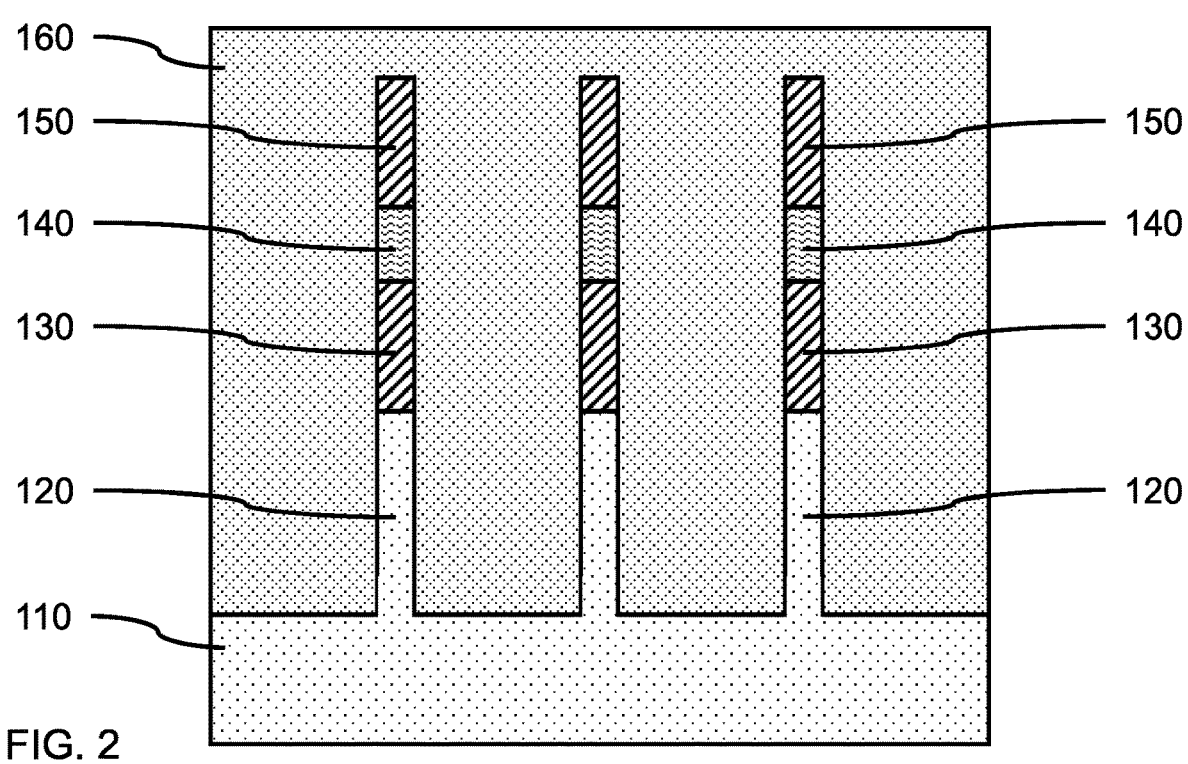
FIG. 2 is a cross-sectional side view showing a cover layer on the plurality of vertical fins and hard mask stacks, in accordance with an embodiment of the present invention.

FIG. 2 is a cross-sectional side view showing a cover layer on the plurality of vertical fins and hard mask stacks, in accordance with an embodiment of the present invention.

In one or more embodiments, a cover layer 160 can be formed on the one or more vertical fins 120 and hard mask stack 155, where the cover layer can be formed by a blanket deposition, for example, spin-on coating that covers the top surface of the third dielectric material layer 150. The blanket deposition can be a spin-on process.

In one or more embodiments, the cover layer 160 can be a strippable organic planarization layer (OPL) that can be selectively removed using a wet chemical etch, for example, reversibly crosslinked polymers. In various embodiments, the cover layer 160 can be selected from OPL materials, including, but not limited to, organic carbon containing materials with a low molecular weight in a range of about 0.6-1 kg/mol, wherein the carbon materials are not initially crosslinked, for example, phenolic functionality containing molecular glass type materials that contain acid cleavable or thermally cleavable end group functionalities, such as phenol-formaldehyde resins. The size of each molecule can be significantly smaller than that of a typical polymeric resist and may possess a very narrow molecular weight distribution. In various embodiments, the OPL for cover layer 160 can be a material such as Novolac.

In various embodiments, the cover layer 160 can be removed using a wet process including, for example, in high polar casting solvents, including, but not limited to, 4-Methyl-2 pentanol. The OPL material of cover layer 160 can be resistant to less polar casting solvent such as propylene glycol monomethyl ether acetate (PGMEA).

Figure 3:
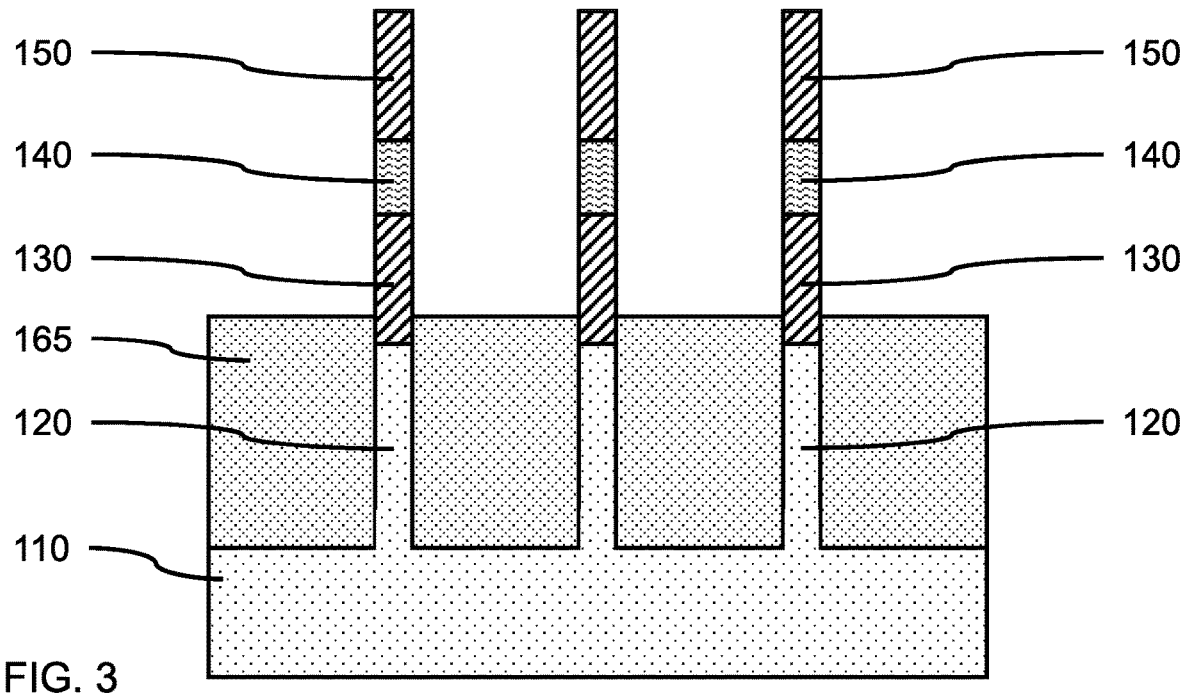
FIG. 3 is a cross-sectional side view showing a reduced height cover layer on the plurality of vertical fins and hard mask stacks, in accordance with an embodiment of the present invention.

FIG. 3 is a cross-sectional side view showing a reduced height cover layer on the plurality of vertical fins and hard mask stacks, in accordance with an embodiment of the present invention.

In one or more embodiments, the height of the cover layer 160 can be reduced to expose portions of the hard mask stack 155, where the height of the cover layer 160 can be reduced using a selective directional etch, for example, a reactive ion etch (RIE) or UV etchback, that removes a portion of the cover layer on the hard mask stack 155 and over the substrate 110. Removal of the portion of the cover layer 160 can expose the third dielectric material layer 150, the second dielectric material layer 140, and portions of the first dielectric material layer 130. The reduced height cover layer 165 can have a height greater than the height of the vertical fins 120, such that the reduced height cover layer 165 fully covers the vertical fins 120.

Figure 4:
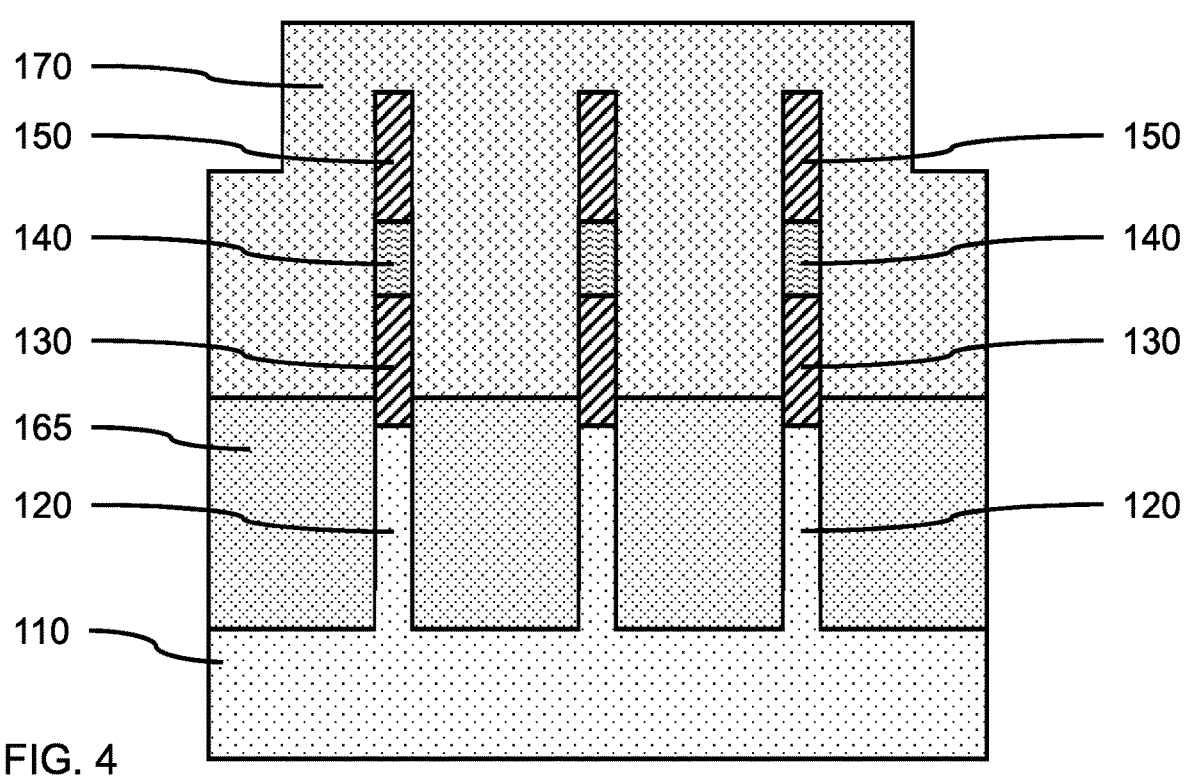
FIG. 4 is a cross-sectional side view showing a bracing layer on the reduced height cover layer, in accordance with an embodiment of the present invention.

FIG. 4 is a cross-sectional side view showing a bracing layer on the reduced height cover layer, in accordance with an embodiment of the present invention.

In one or more embodiments, a bracing layer 170 can be formed on the hard mask stacks 155 and reduced height cover layer 165, where the bracing layer 170 can be formed by a blanket deposition. The blanket deposition can be a spin-on process that provides a bracing layer 170 with a varying thickness, where the vertical fins 120 and hard mask stacks 155 can cause a buildup of the bracing layer 170 material to provide a greater thickness on the hard mask stacks 155 than on portions of the reduced height cover layer 165 and substrate 110 without vertical fins 120 and hard mask stacks 155.

In various embodiments, the spin-on process parameters can be adjusted to control the build-up of the bracing layer 170 on the vertical fins 120 and hard mask stacks 155, where the difference between the greater thickness on the vertical fins 120 and the lesser thickness of the bracing layer 170 over the substrate 110 can be in the range of about 10 nm to about 50 nm, or about 20 nm to about 40 nm.

In one or more embodiments, the bracing layer 170 can be a dry-ashable organic planarization layer (OPL) that can be selectively removed using a dry plasma etch. The bracing layer 170 can be a different organic planarization layer (OPL) material than the cover layer 160, so the reduced height cover layer 165 can be selectively removed, while a bracing segment remains on the hard mask stack 155. In various embodiments, the bracing layer 170 can be selected from OPL materials and carbon rich (>50%) polymeric materials, including, but not limited to, a near-frictionless carbon (NFC) material, a polyimide, spin on carbon or deposited carbon. The second OPL material may be formed utilizing a deposition process such as, for example, spin-on PGMEA, chemical vapor deposition (CVD), plasma enhanced CVD (PECVD), evaporation, chemical solution deposition and other like deposition techniques. The OPL material of the bracing layer 170 can be resistant to the polar solvents that wet strip the OPL material of the cover layer 160. The bracing layer 170 can be bakeable to provide a mechanically rigid material on the hard mask stack 155. In various embodiments, the OPL materials of the bracing layer 170 can be higher molecular weight polymeric materials than the cover layer 160, where the molecular weights can be greater than 1 kg/mol for example 1-10 kg/mole. In various embodiments, the OPL for bracing layer 170 can be a material such as ODL-401 (commercially available from Shin-etsu Chemical, Co., Ltd).

Figure 5:
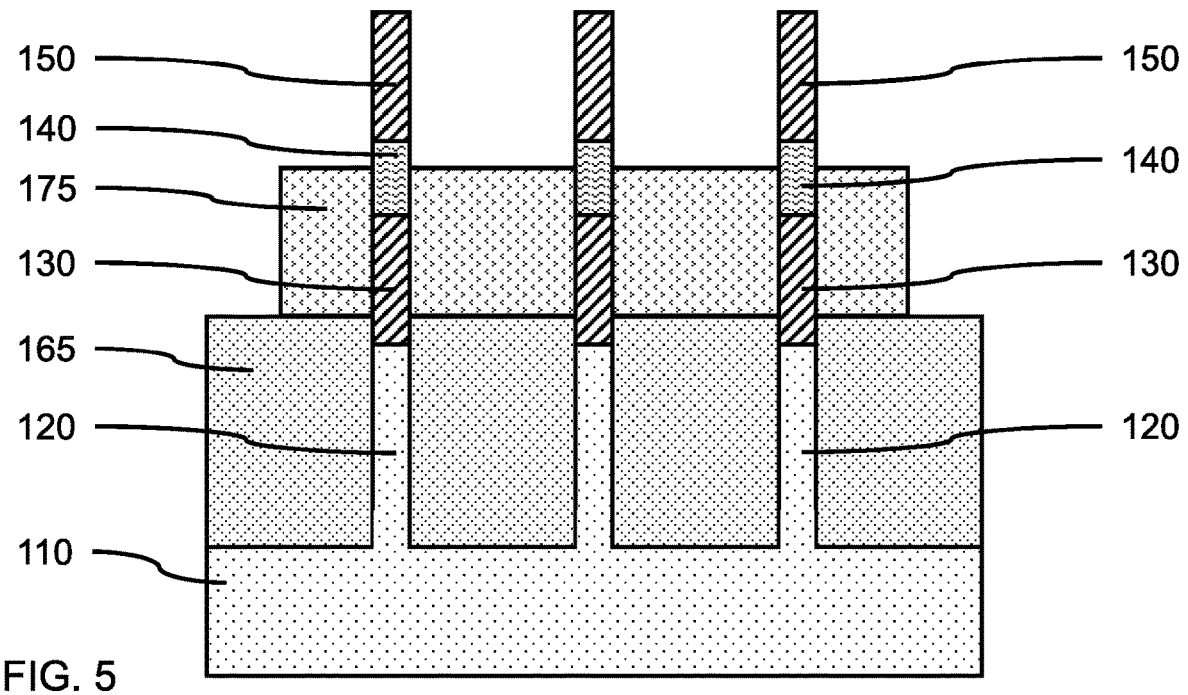
FIG. 5 is a cross-sectional side view showing a bracing segment on the reduced height cover layer, in accordance with an embodiment of the present invention.

FIG. 5 is a cross-sectional side view showing a bracing segment on the reduced height cover layer, in accordance with an embodiment of the present invention.

In one or more embodiments, portions of the bracing layer 170 can be removed using a selective, directional etch (e.g., a reactive ion etch (RIE)), where thinner sections of the bracing layer over portions of the substrate without vertical fins 120 can be removed to expose the underlying reduced height cover layer 165. The height of the thicker sections of the bracing layer 170 can be reduced to form bracing segment(s) 175 on the hard mask stack 155 and underlying portions of the underlying reduced height cover layer 165. The removal can be a timed etch to control the thickness of the bracing layer removed. In various embodiments, at least a portion of the third dielectric material layer 150 can be exposed after etching back the bracing layer 170. At least a portion of the second dielectric material layer 140 may be exposed by etching back the bracing layer 170.

In various embodiments, the bracing segment(s) 175 can have a thickness sufficient to cover portions of the first dielectric material layer 130 and second dielectric material layer 140. The thickness of the bracing segment(s) 175 can be about the same as the difference in thickness between the thicker and thinner sections of the bracing layer 170, which can be in the range of about 10 nm to about 50 nm, or about 20 nm to about 40 nm. A portion of the first dielectric material layer 130 can be covered by the reduced height cover layer 165.

Figure 6:
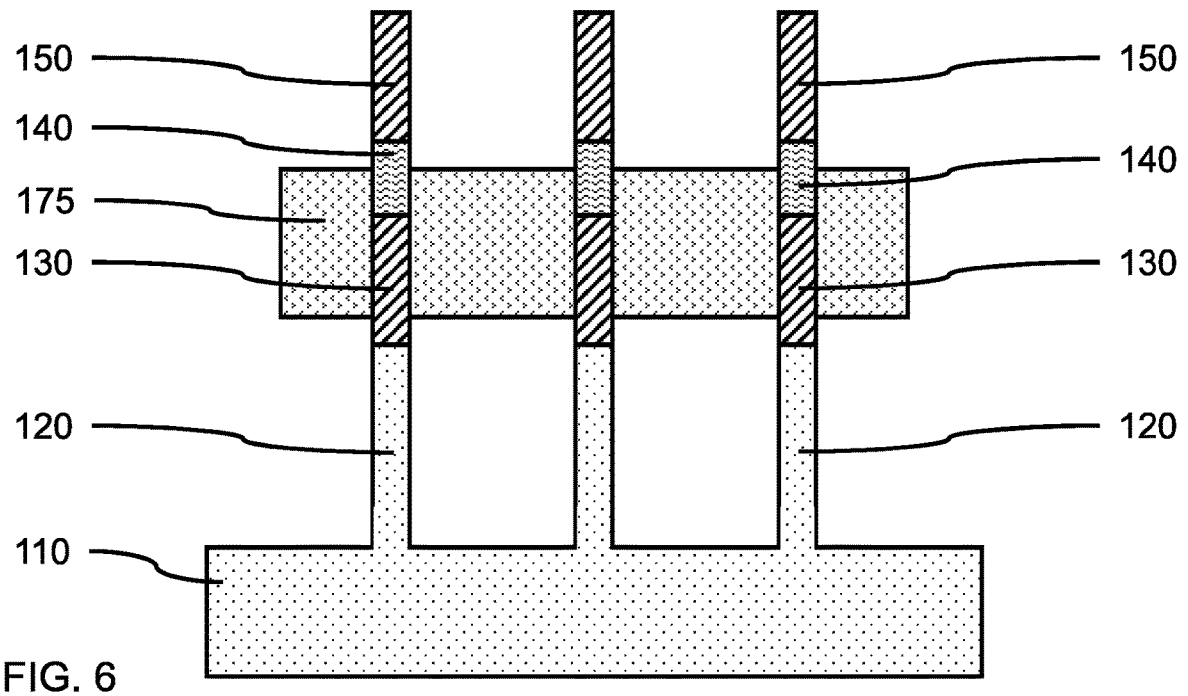
FIG. 6 is a cross-sectional side view showing a bracing segment athwart a portion of the hard mask stacks after removing the reduced height cover layer, in accordance with an embodiment of the present invention.

FIG. 6 is a cross-sectional side view showing a bracing segment athwart a portion of the hard mask stacks after removing the reduced height cover layer, in accordance with an embodiment of the present invention.

In one or more embodiments, the reduced height cover layer 165 can be removed using a selective etch (e.g., wet solvent etch), where the bracing segment 175 can remain athwart a portion of the hard mask stacks 155. The wet solvent etch can include a polar solvent, for example, 4-Methyl-2-pentanol.

In one or more embodiments, the bracing segment 175 can span one or more pairs of hard mask stacks 155, where the bracing segment 175 can fill the gap between adjacent pairs of hard mask stacks 155 and project outward from the sidewalls of the hard mask stacks 155 at the periphery of a row of vertical fins 120. The bracing segment 175 can be attached to at least portions of the sidewalls of the first dielectric material layer 130 and second dielectric material layer 140. The portions of the bracing segment 175 between adjacent hard mask stacks can be unsupported from underneath, where void spaces are formed between the vertical fins 120 by the removal of the reduced height cover layer 165. The vertical fins 120, substrate surface, and a portion of the first dielectric material layer 130 can be exposed by removal of the reduced height cover layer 165. The void space can be sufficient to allow a wet cleaning solution to access the entire sidewalls and end walls of the vertical fins 120, as well as the top surface of the substrate 110.

In various embodiments, the bracing segment 175 athwart the hard mask stacks 155 can be sufficiently rigid to prevent the vertical fins 120 and hard mask stacks from becoming inclined due to uneven forces applied to at least the vertical fins 120, which can be during a wet clean or drying of the vertical fins 120 and substrate 110. In various embodiments, the bracing segment 175 can cover at least half (½) the height of the hard mask stacks 155 to provide sufficient support to prevent the vertical fins 120 and hard mask stacks from becoming inclined.

Figure 7:
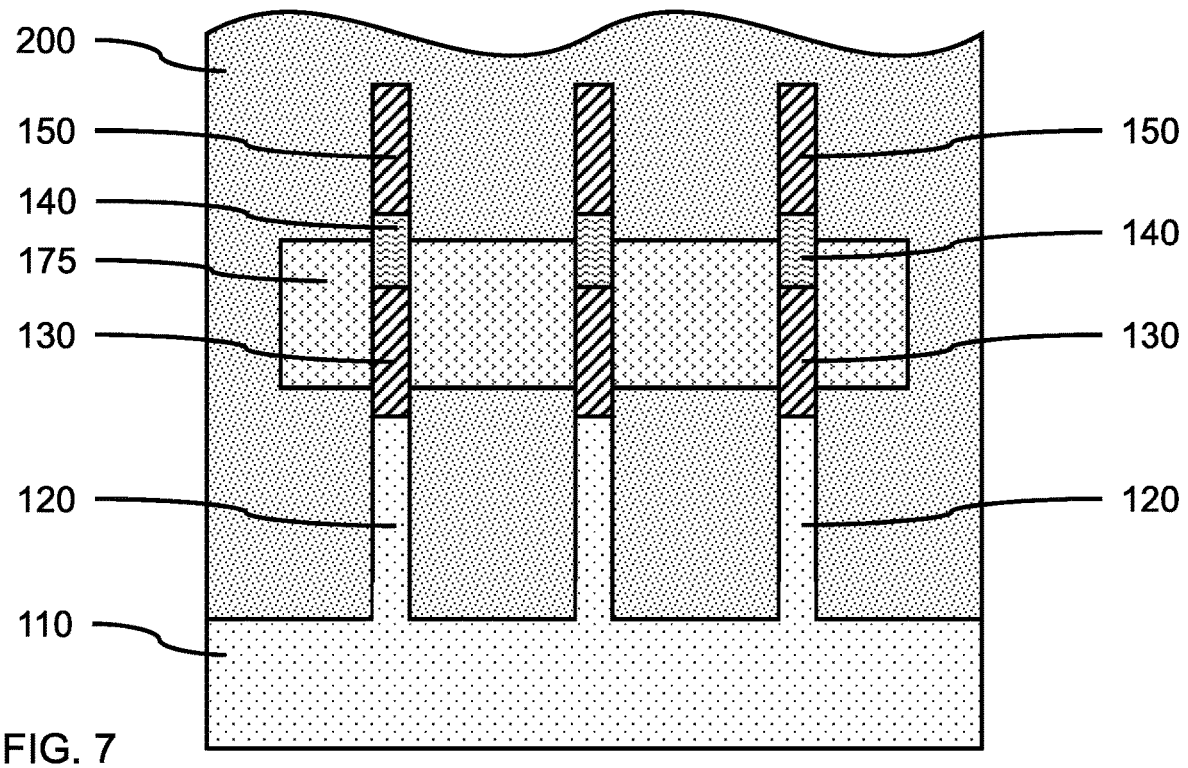
FIG. 7 is a cross-sectional side view showing a wet clean of the vertical fins and substrate with the bracing segment providing lateral reinforcement to the hard mask stacks, in accordance with an embodiment of the present invention.

FIG. 7 is a cross-sectional side view showing a wet clean of the vertical fins and substrate with the bracing segment providing lateral reinforcement to the hard mask stacks, in accordance with an embodiment of the present invention.

In one or more embodiments, the substrate 110, vertical fins 120, bracing segment(s) 175 and exposed portions of the first dielectric material layer 130, second dielectric material layer 140, and third dielectric material layer 150 can be exposed to a cleaning solution 200, where the cleaning solution can be deionized water (DI $H_2O$) and isopropyl alcohol (IPA) (i.e., propan-2-ol, $CH_3CHOHCH_3$), where the ratio of isopropyl alcohol to deionized water can be adjusted to control the surface tension of the solution or to form an azeotrope (e.g., about 91 volume % IPA). The void spaces between the vertical fins 120 can be filled with the cleaning solution 200, which can surround the bracing segment 175, and be above the tops of the third dielectric material layer 150. Other cleaning solutions could include dilute hydrogen fluoride, sulfuric acid, and peroxide solutions, where the compositions are adjusted to control surface tension.

Figure 8:
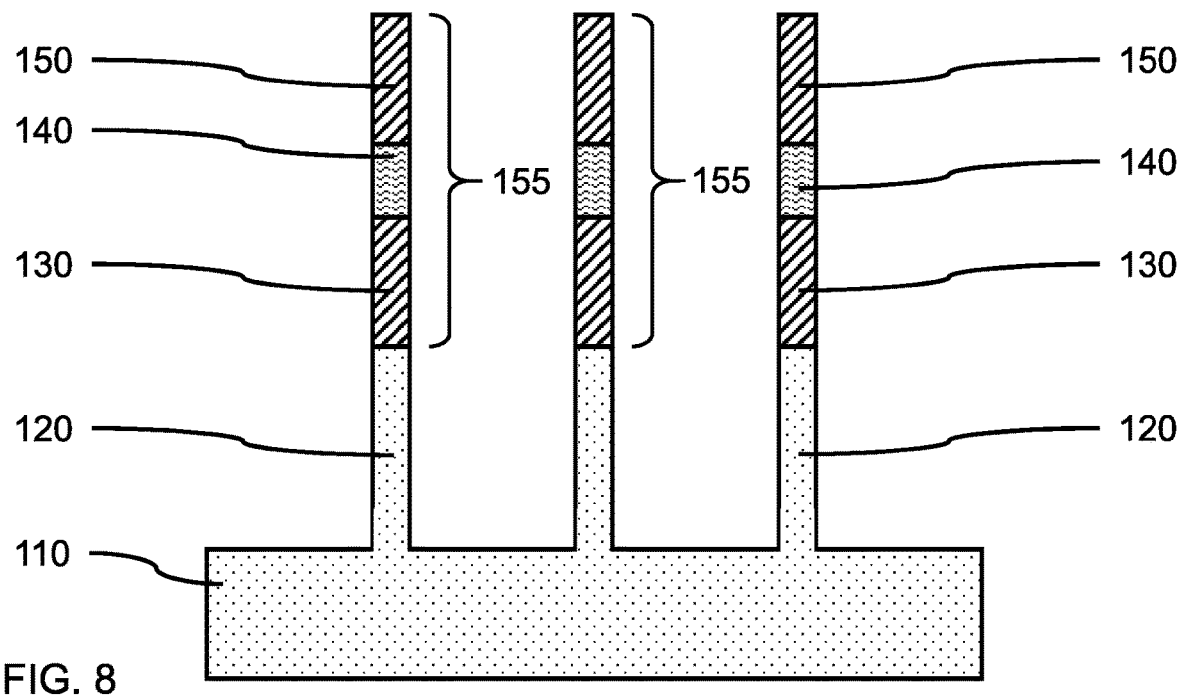
FIG. 8 is a cross-sectional side view showing a plurality of vertical fins on a substrate, and a hard mask stack on each of the vertical fins after a wet clean and removing the bracing segment, in accordance with an embodiment of the present invention.

FIG. 8 is a cross-sectional side view showing a plurality of vertical fins on a substrate, and a hard mask stack on each of the vertical fins after a wet clean and removing the bracing segment, in accordance with an embodiment of the present invention.

In one or more embodiments, the cleaning solution 200 can be removed to expose the substrate 110, vertical fins 120, bracing segment(s) 175 and exposed portions of the first dielectric material layer 130, second dielectric material layer 140, and third dielectric material layer 150. The cleaning solution 200 can be removed, for example, by vacuum drying at a temperature of about 25° C. to about 150° C., about 25° C. to about 50° C., or about 90° C. to about 150° C., for a duration of about 30 seconds (sec) to about 120 sec, or about 60 sec. The bracing segment 175 can resist the uneven surface tensions pulling on the vertical fins 120 to prevent fin collapse during the drying process. Uneven amounts of cleaning solution in contact with the vertical fins 120 and hardmask stacks 155 can exert uneven forces on the vertical fins and hardmask stacks that the bracing segment 175 resists.

In one or more embodiments, the bracing segment(s) 175 can be removed using a dry ashing process, where the dry ashing process can include a dry plasma (e.g., $O_2$ plasma) to remove the bracing segment(s) 175 without etching the vertical fins 120, substrate 110, and hard mask stack.

Figure 9:
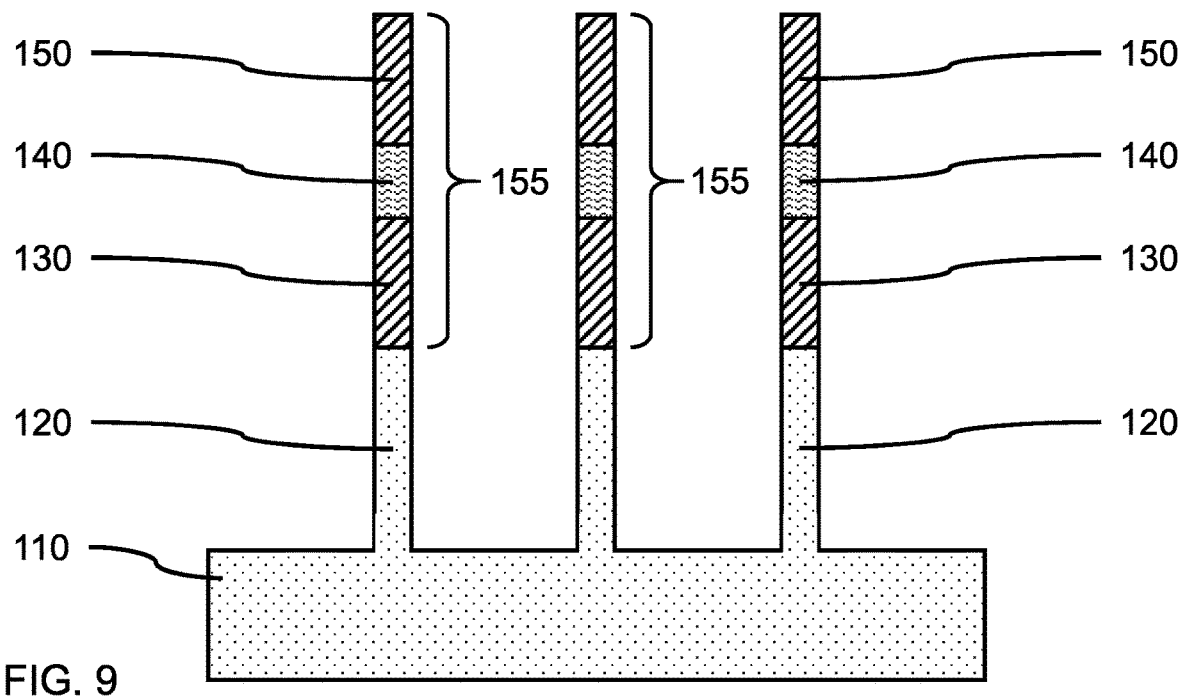
FIG. 9 is a cross-sectional side view showing a plurality of vertical fins on a substrate, and a hard mask stack on each of the vertical fins, in accordance with another embodiment of the present invention.

FIG. 9 is a cross-sectional side view showing a plurality of vertical fins on a substrate, and a hard mask stack on each of the vertical fins, in accordance with another embodiment of the present invention.

In one or more embodiments, one or more vertical fins 120 can be formed on a substrate 110, and a hard mask stack 155 can be formed on each of the one or more vertical fins 120.

Figure 10:
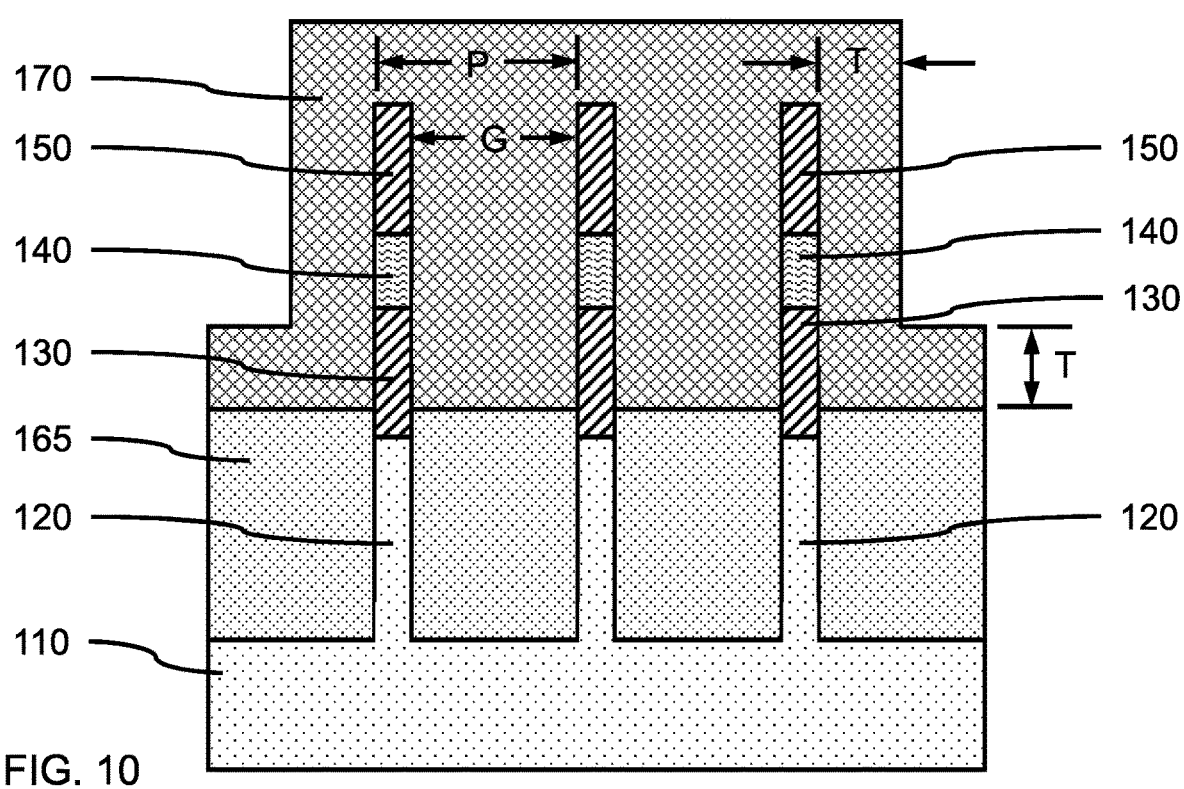
FIG. 10 is a cross-sectional side view showing a bracing layer on the reduced height cover layer, in accordance with another embodiment of the present invention.

FIG. 10 is a cross-sectional side view showing a bracing layer on the reduced height cover layer, in accordance with another embodiment of the present invention.

In one or more embodiments, a reduced height cover layer 165 can be formed on the one or more vertical fins 120 and lower portion of the hard mask stack 155, where the reduced height cover layer 165 can be an organic planarization layer (OPL) formed by a spin-on process.

In one or more embodiments, a bracing layer 170 can be formed on the reduced height cover layer 165, where the bracing layer 170 can be formed by a conformal deposition, for example, atomic layer deposition (ALD) plasma enhanced ALD (PEALD), low pressure chemical vapor deposition (LPCVD), or a combination thereof. The thickness, T, of the bracing layer 170 deposited on the vertical fins 120 and hard mask stacks 155 can be equal to or greater than half the gap distance, G, between facing sidewalls of adjacent vertical fins 120 and hard mask stacks 155, so the bracing layer 170 fills in and pinches off the space between adjacent vertical fins 120 and hard mask stacks 155. The vertical fins 120 and associated hard mask stacks 155 can be separated by a pitch, P, in the range of about 20 nm to about 80 nm, or about 40 nm to about 60 nm, although other pitches are also contemplated. In various embodiments, the bracing layer 170 can have a thickness in a range of about 5 nm to about 37 nm, or about 15 nm to about 25 nm, although other thicknesses are also contemplated.

In one or more embodiments, the bracing layer 170 can be a dielectric or semiconductor material, including, but not limited to, amorphous carbon (a-C), amorphous silicon (a-Si), and silicon-germanium (SiGe), that can be selectively removed relative to the materials of the substrate 110, vertical fins 120, reduced height cover layer 165, first dielectric material layer 130, second dielectric material layer 140, and third dielectric material layer 150.

Figure 11:
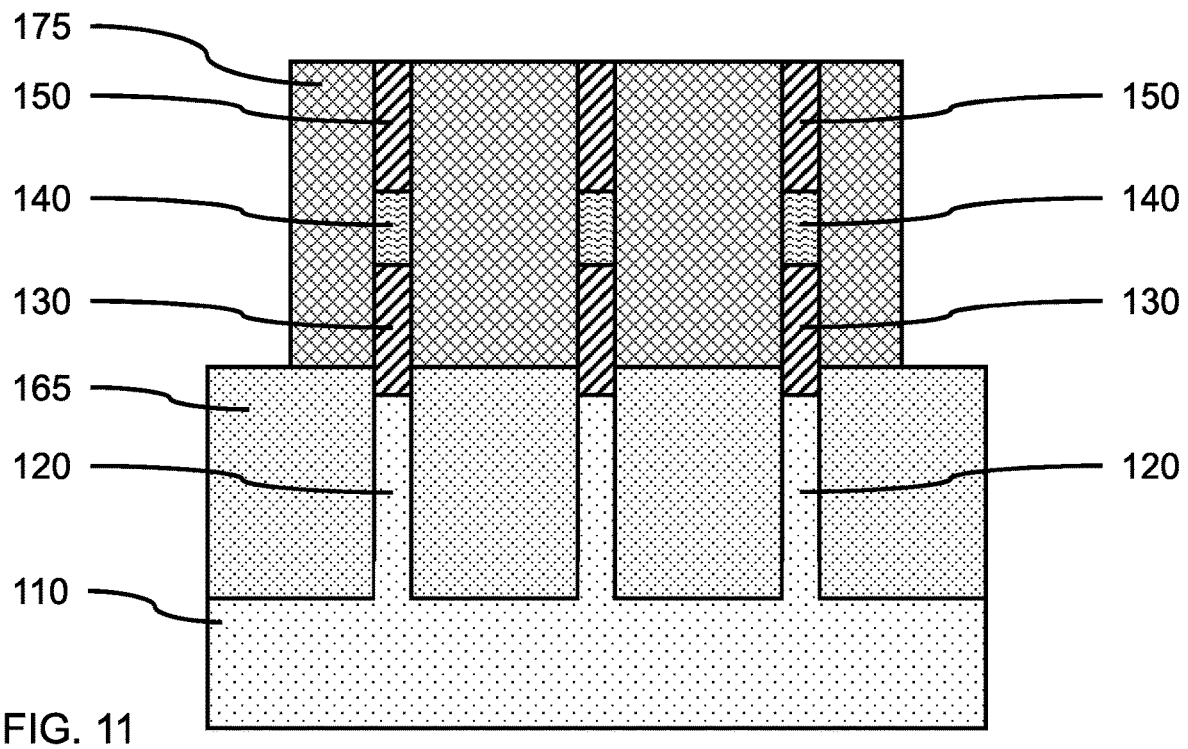
FIG. 11 is a cross-sectional side view showing a bracing segment on the reduced height cover layer, in accordance with another embodiment of the present invention.

FIG. 11 is a cross-sectional side view showing a bracing segment on the reduced height cover layer, in accordance with another embodiment of the present invention.

In one or more embodiments, portions of the bracing layer 170 can be removed to expose portions of the reduced height cover layer 165 away from the vertical fins 120, where the portions of the bracing layer 170 can be removed using a directional etch (e.g., RIE). The top surfaces of the third dielectric material layer 150 may be exposed by etching back the bracing layer 170. Portions of the bracing layer 170 can remain in the space between adjacent hard mask stacks 155 to form a bracing segment 175 that bridges the gap between facing sidewalls of adjacent hard mask stacks 155. The bracing segment 175 can be attached to at least portions of the sidewalls of the first dielectric material layer 130, second dielectric material layer 140, and third dielectric material layer 150. The bracing segment 175 can cover the sidewalls of the second dielectric material layer 140 and third dielectric material layer 150.

Figure 12:
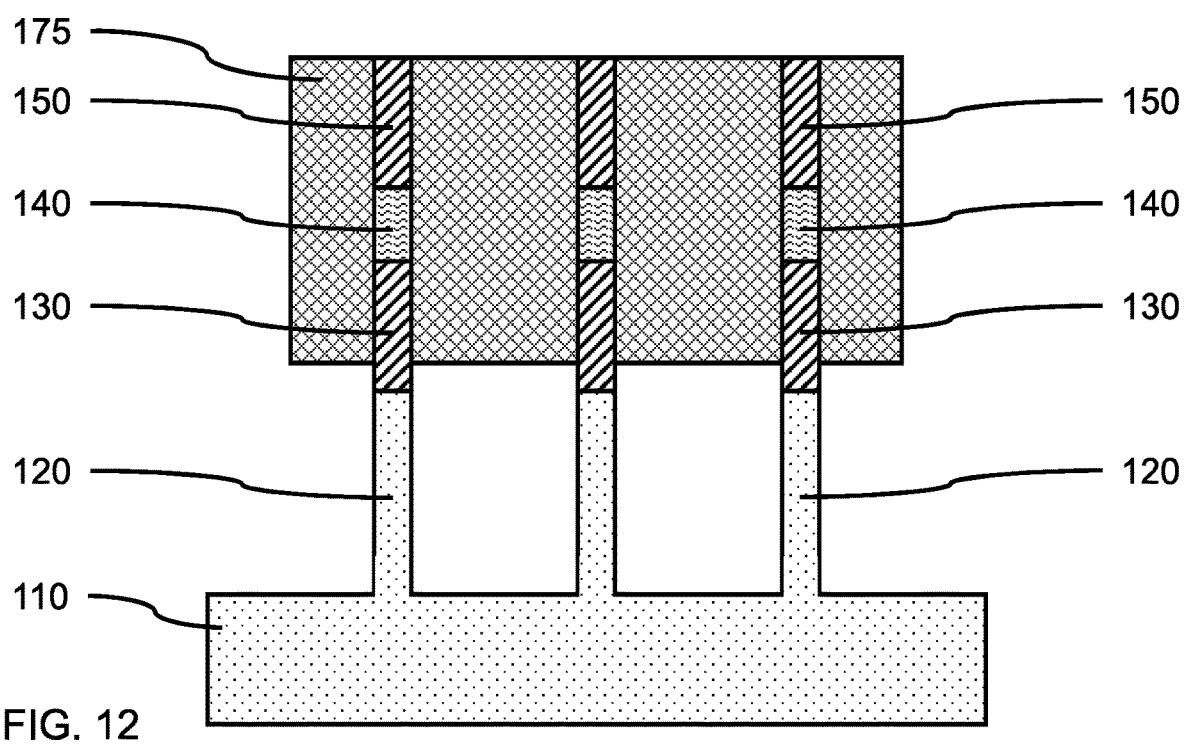
FIG. 12 is a cross-sectional side view showing a bracing segment athwart a portion of the hard mask stacks after removing the reduced height cover layer, in accordance with another embodiment of the present invention.

FIG. 12 is a cross-sectional side view showing a bracing segment athwart a portion of the hard mask stack after removing the reduced height cover layer, in accordance with another embodiment of the present invention.

In one or more embodiments, the reduced height cover layer 165 can be removed using a selective etch (e.g., wet solvent etch), where the bracing segment 175 can remain athwart a portion of the hard mask stacks 155. The bracing segment 175 can span one or more pairs of hard mask stacks 155, where the bracing segment 175 can fill the gap between adjacent pairs of hard mask stacks 155 and project outward from the sidewalls of the hard mask stacks 155 at the periphery of a row of vertical fins 120. The bracing segment 175 can be attached to at least portions of the sidewalls of the first dielectric material layer 130, second dielectric material layer 140, and third dielectric material layer 150. The portions of the bracing segment 175 between adjacent hard mask stacks can be unsupported from underneath, where void spaces are formed between the vertical fins 120 by the removal of the reduced height cover layer 165.

Figure 13:
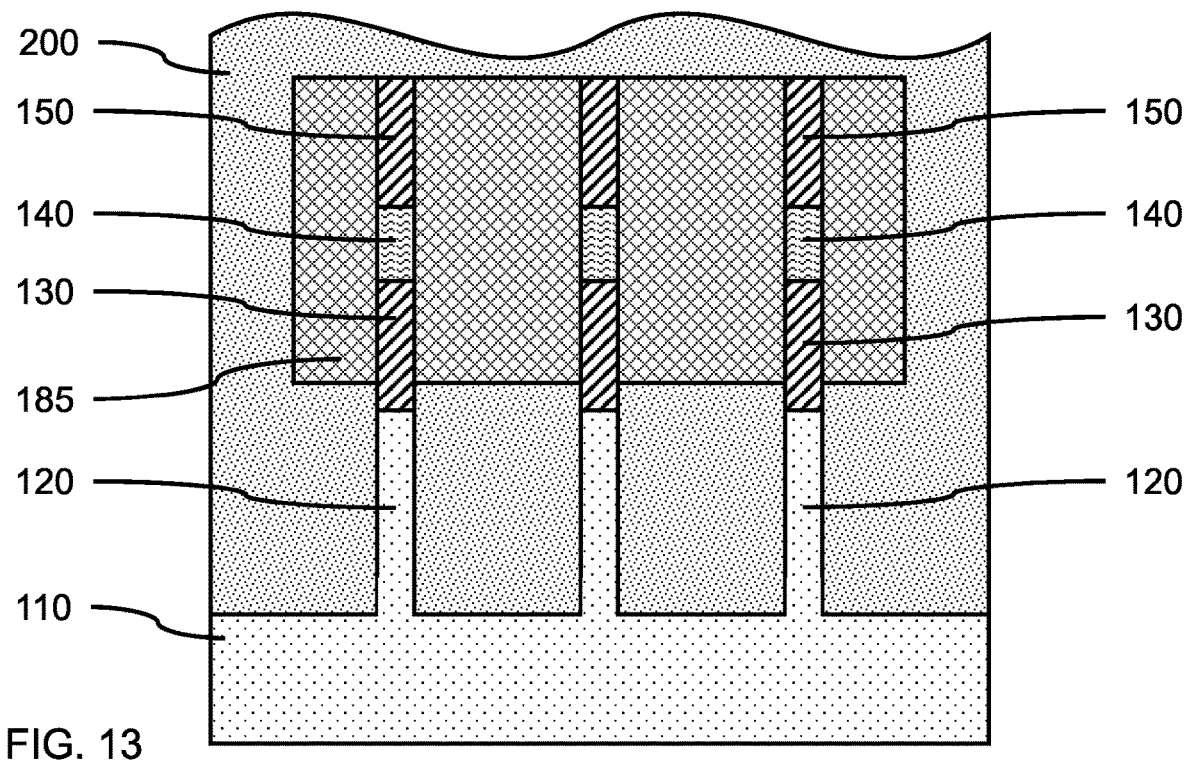
FIG. 13 is a cross-sectional side view showing a wet clean of the vertical fins and substrate with the bracing segment providing lateral reinforcement to the hard mask stacks, in accordance with another embodiment of the present invention.

FIG. 13 is a cross-sectional side view showing a wet clean of the vertical fins and substrate with the bracing segment providing lateral reinforcement to the hard mask stacks, in accordance with another embodiment of the present invention.

In one or more embodiments, the substrate 110, vertical fins 120, bracing segment(s) 175 and exposed portions of the first dielectric material layer 130, second dielectric material layer 140, and third dielectric material layer 150 can be exposed to a cleaning solution 200. The void space can be sufficient to allow the wet cleaning solution to access the entire sidewalls and end walls of the vertical fins 120, as well as the top surface of the substrate 110.

Figure 14:
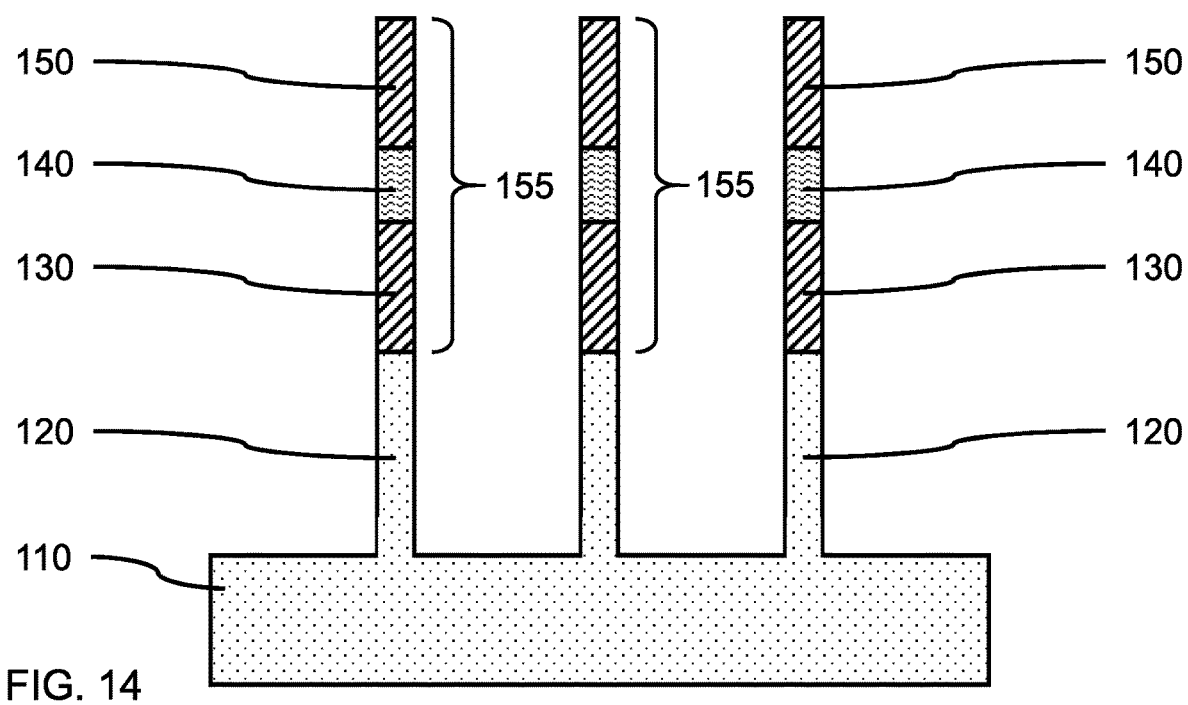
FIG. 14 is a cross-sectional side view showing a plurality of vertical fins on a substrate, and a hard mask stack on each of the vertical fins after a wet clean and removing the bracing segment, in accordance with another embodiment of the present invention.

FIG. 14 is a cross-sectional side view showing a plurality of vertical fins on a substrate, and a hard mask stack on each of the vertical fins after a wet clean and removing the bracing segment, in accordance with another embodiment of the present invention.

In one or more embodiments, the wet cleaning solution 200 can be removed, for example, by vacuum drying.

In one or more embodiments, the bracing segment(s) 175 can be removed by a selective isotropic etch, for example, a dry plasma etch or wet chemical etch, selective for the material of the bracing segment(s) 175.

Figure 15:
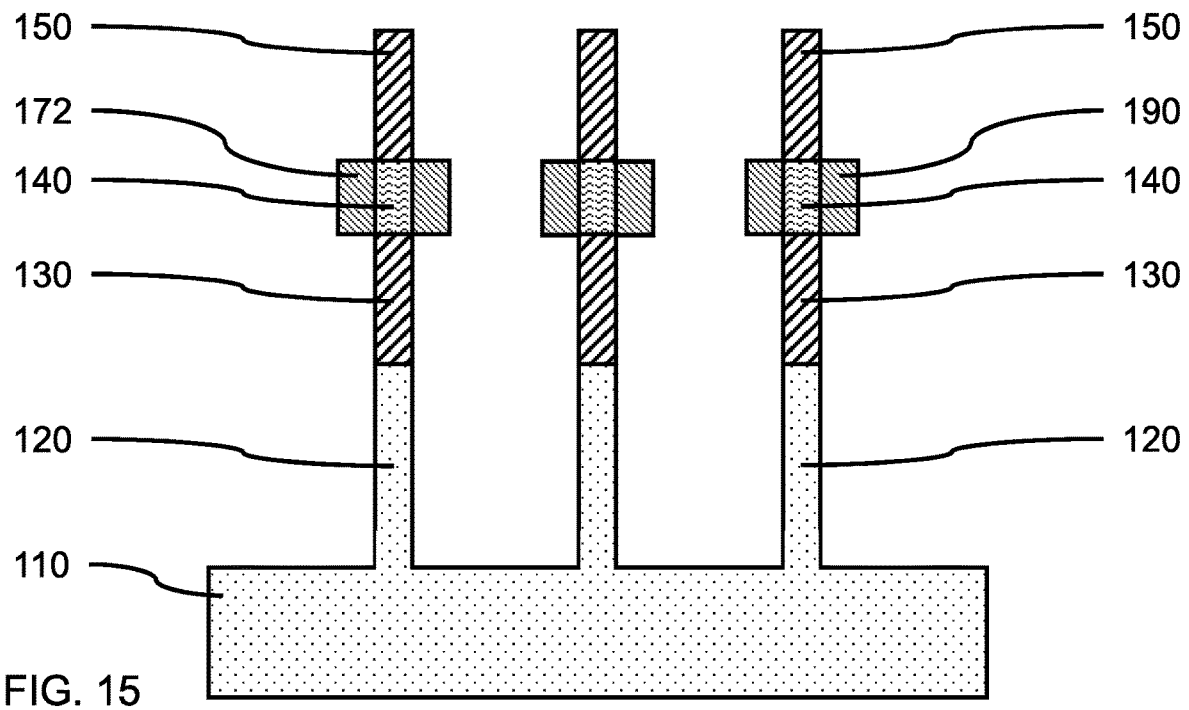
FIG. 15 is a cross-sectional side view showing a protruding growth block formed on a portion of the hard mask stack, in accordance with yet another embodiment of the present invention.

FIG. 15 is a cross-sectional side view showing a protruding growth block formed on a portion of the hard mask stack, in accordance with yet another embodiment of the present invention.

In one or more embodiments, a protruding growth block 172 can be formed on a portion of the hard mask stack 155, where the protruding growth block 172 can be formed by selective ALD on a predetermined portion of the hard mask stack 155. In various embodiments, a protruding growth block 172 can be formed on each of the second dielectric material layers 140 of the one or more hard mask stacks 155 by atomic layer deposition (ALD) selective for the material of the second dielectric material layers 140. The growth blocks 172 can deposit uniformly on the sidewall(s) and end wall(s) of the hard mask stack 155 and extend laterally outward.

In various embodiments, the protruding growth block 172 can be an oxide material that can be selectively formed by ALD, including, but not limited to, hafnium oxide (HfO), zirconium oxide (ZrO), and aluminum oxide (AlO).

Figure 16:
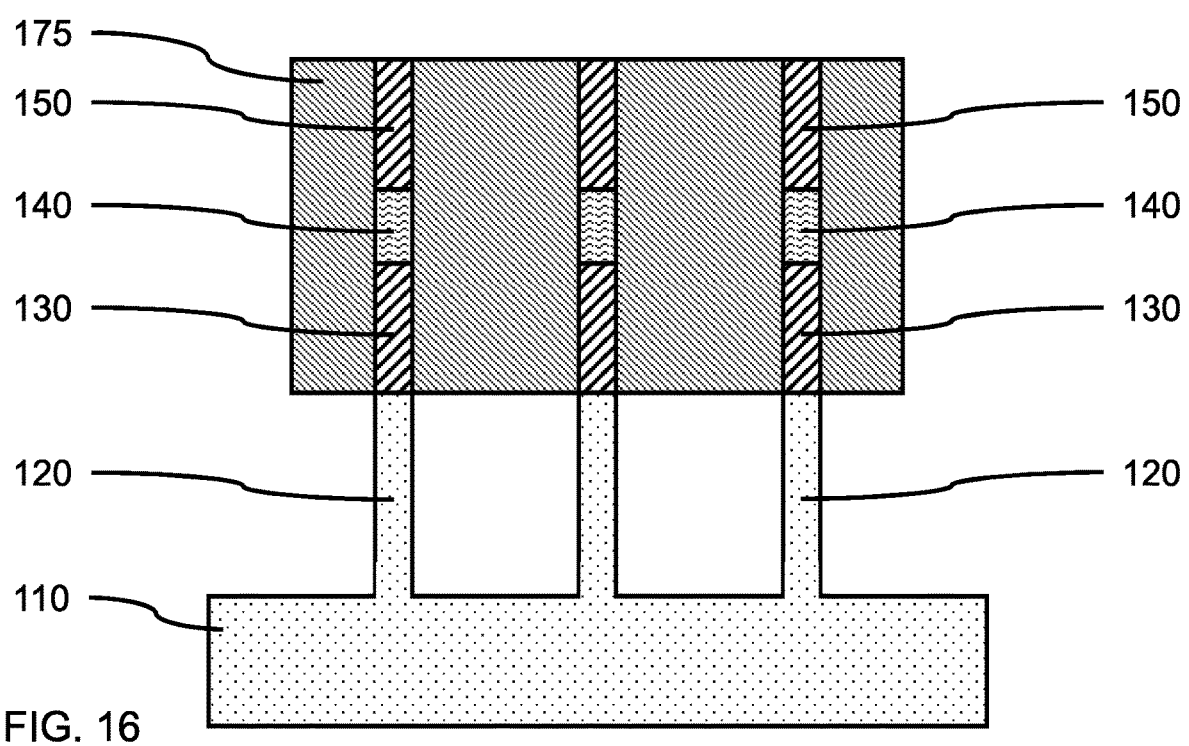
FIG. 16 is a cross-sectional side view showing a bracing segment formed on the hard mask stacks by merging the protruding growth blocks, in accordance with yet another embodiment of the present invention.

FIG. 16 is a cross-sectional side view showing a bracing segment formed on the hard mask stacks by merging the protruding growth blocks, in accordance with yet another embodiment of the present invention.

In one or more embodiments, the selective deposition can be continued to increase the size of the protruding growth blocks 172 on adjacent hard mask stacks 155 until the protruding growth blocks merged into a bracing segment 175 that spans one or more pairs of hard mask stacks. The growth blocks 172 can also grow vertically along the sidewalls of the hard mask stacks, where the growth can be symmetrical, where the first dielectric material layer 130 and third dielectric material layer 150 can be uniformly covered. The formation of the bracing segment 175 can be stopped before an upper portion of the vertical fins 120 are covered by the bracing segment 175. A cover layer 160 or reduced height cover layer may not be formed, since the protruding growth blocks 172 are formed on the hard mask stacks 155 without the need of an underlying supporting surface to assist in the formation of the bracing segment 175 or prevent the formation of the bracing segment 175 on the vertical fin sidewalls.

Figure 17:
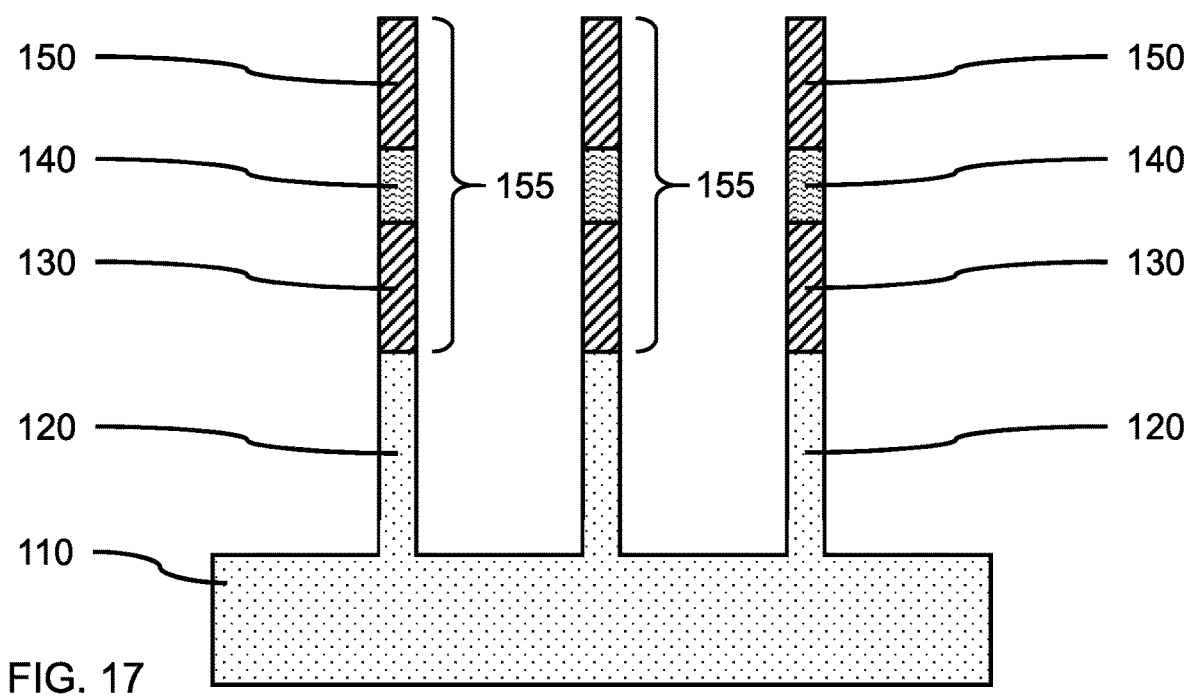
FIG. 17 is a cross-sectional side view showing a plurality of vertical fins on a substrate, and a hard mask stack on each of the vertical fins after a wet clean and removing the bracing segment, in accordance with yet another embodiment of the present invention.

FIG. 17 is a cross-sectional side view showing a plurality of vertical fins on a substrate, and a hard mask stack on each of the vertical fins after a wet clean and removing the bracing segment, in accordance with yet another embodiment of the present invention.

In one or more embodiments, the bracing segment 175 can be removed by a selective isotropic etch (e.g., wet chemical etch, dry plasma etch) to expose the hard mask stack(s) 155.

Figure 18:
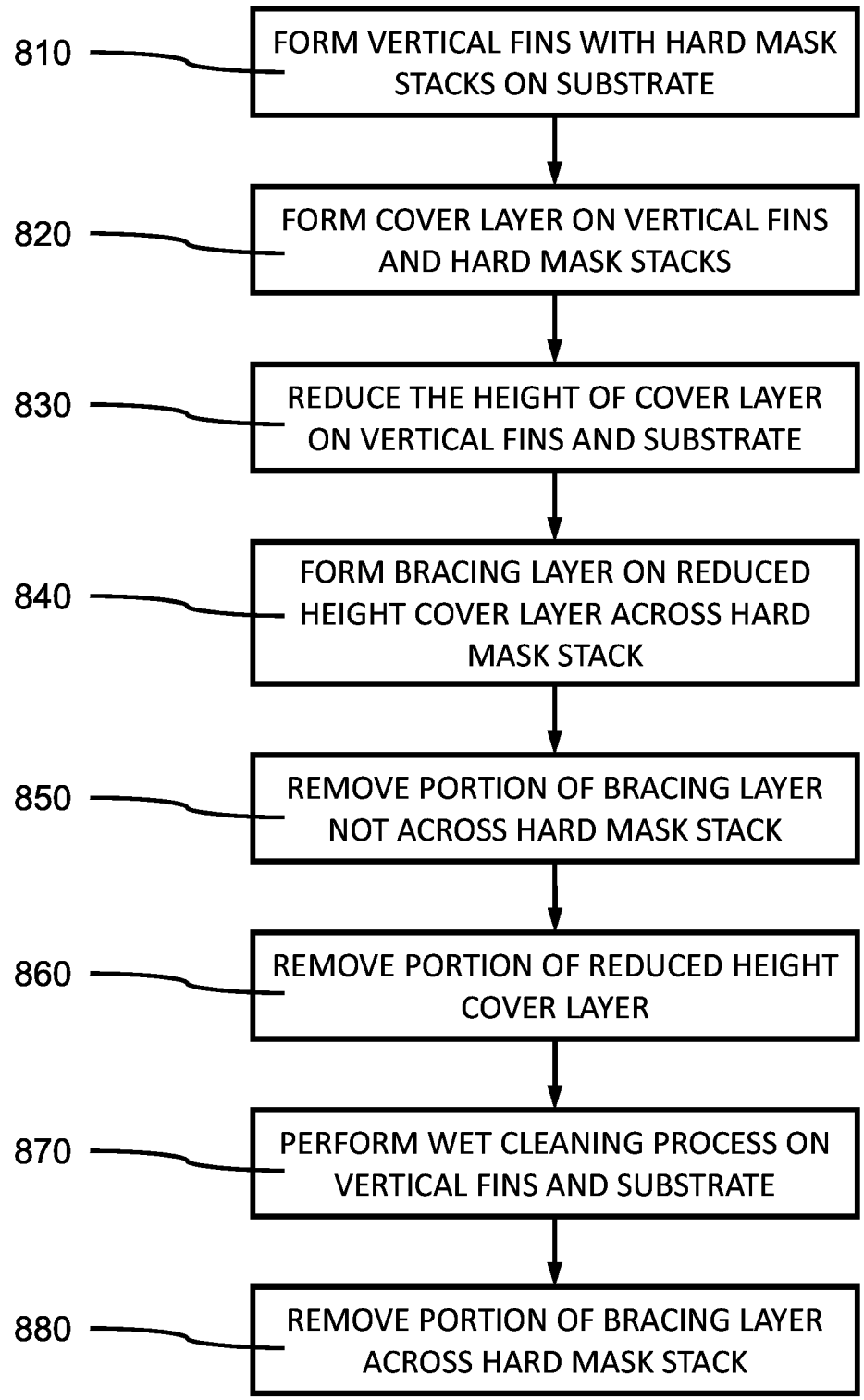
FIG. 18 is a block/flow diagram showing a bracing formation process and wet clean, in accordance with yet another embodiment of the present invention.

FIG. 18 is a block/flow diagram showing a bracing formation process and wet clean, in accordance with yet another embodiment of the present invention.

In block 810, one or more vertical fins can be formed on a substrate, where the vertical fins can be formed by a sidewall image transfer (SIT) process or a direct-write lithographic process. A hard mask stack can be formed on each of the vertical fins as part of the fin formation process. The hard mask stack can be formed from a plurality of hard mask material layers deposited on a substrate, where a directional etch (e.g., RIE) can remove portions of the hard mask material layers and substrate. In various embodiments, the hard mask stack can include three layers, where a middle layer is a different dielectric material from the underlying and overlying layers.

In block 820, a cover layer can be blanket deposited on the substrate, vertical fins, and hard mask stacks, where the cover layer can extend above the tops of the hard mask stacks.

In block 830, the height (i.e., thickness) of the cover layer can be reduced using an etch-back process (e.g., RIE), where the height of the cover layer can be sufficiently reduced to expose most of the three layers forming the hard mask stack, while the vertical fins remain covered by the cover layer.

In block 840, a bracing layer can be formed on the reduced height cover layer and hard mask stacks by a spin-on process, a conformal deposition process, or a selective deposition process.

In block 850, a portion of the bracing layer can be removed to form a bracing segment across the hard mask stacks by a directional etch.

In block 860, the reduced height cover layer can be removed to expose the vertical fins and substrate for cleaning, where the reduced height cover layer can be removed using a polar aprotic organic solvent, for example, 4-Methyl-2-pentanol, as well as TechniStrip® P1316 and P1331 and TechniStrip® NI555 (available from Micro-Chemicals GmbH, Ulm, Germany).

In block 870, the vertical fins and substrate can be cleaned using a cleaning solution.

In block 880, the bracing layer can be removed by an isotropic etch, for example, a wet chemical strip or a dry ashing (e.g., $O_2$ plasma etch).

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will he understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of preventing the collapse of fin structures, comprising:
   forming a plurality of vertical fins on a substrate, and a hard mask stack on each of the vertical fins;
   forming a cover layer on the plurality of vertical fins and hard mask stacks;
   reducing the height of the cover layer to expose an upper portion of each of the hard mask stacks and thus forming a reduced height cover layer;
   forming a bracing layer on the reduced height cover layer and exposed portion of each of the hard mask stacks;
   removing a portion of the bracing layer to expose a portion of the reduced height cover layer and form a bracing segment on the exposed portion of each of the hard mask stacks; and
   removing the reduced height cover layer.

2. The method of claim 1, wherein the cover layer is an organic planarization layer material.

3. The method of claim 2, wherein the organic planarization layer material is a phenolic functionality containing molecular glass type material.

4. The method of claim 2, wherein the bracing layer is an organic planarization layer material different from the organic planarization layer material of the cover layer.

5. The method of claim 4, wherein the bracing layer is a near frictionless carbon or polyimide material.

6. The method of claim 1, wherein the bracing layer is formed by a spin-on process.

7. The method of claim 1, wherein the bracing layer is formed by a conformal deposition.

8. The method of claim 1, wherein the bracing layer is formed by a selective deposition.

9. The method of claim 1, wherein the reduced height cover layer is removed using a polar organic solvent.

10. A method of preventing the collapse of fin structures, comprising:
    forming a plurality of vertical fins on a substrate, and a hard mask stack on each of the vertical fins;
    forming a cover layer on the plurality of vertical fins and hard mask stacks;
    reducing the height of the cover layer to expose an upper portion of each of the hard mask stacks and thus forming a reduced height cover layer;
    forming a bracing layer on the reduced height cover layer and exposed portion of each of the hard mask stacks;
    removing a portion of the bracing layer to expose a portion of the reduced height cover layer and form a bracing segment on the exposed portion of each of the hard mask stacks;
    removing the reduced height cover layer;
    exposing the plurality of vertical fins to a wet cleaning solution; and
    removing the bracing segment.

11. The method of claim 10, wherein the plurality of vertical fins and hard mask stack has an aspect ratio of at least 10:1.

12. The method of claim 11, wherein the plurality of vertical fins have a height in a range of about 50 nanometers (nm) to about 100 nm, and the plurality of vertical fins have a width in a range of about 5 nm to about 12 nm.

13. The method of claim 10, wherein the hard mask stack includes a first dielectric material layer on each of the plurality of vertical fins, a second dielectric material layer on the first dielectric material layer, and a third dielectric material layer on the second dielectric material layer.

14. The method of claim 13, wherein the first dielectric material layer and third dielectric material layer are a nitride dielectric material, and the second dielectric material layer is an oxide dielectric material.

15. The method of claim 13, wherein the first dielectric material layer and third dielectric material layer have a height in a range of about 40 nm to about 60 nm, and the second dielectric material layer has a height in a range of about 25 nm to about 50 nm.

16. A method of preventing the collapse of fin structures, comprising:
    forming a plurality of vertical fins on a substrate, and a hard mask stack on each of the vertical fins, wherein the hard mask stack includes a first dielectric material layer on each of the plurality of vertical fins, a second dielectric material layer on the first dielectric material layer, and a third dielectric material layer on the second dielectric material layer;
    forming a bracing segment on each of the hard mask stacks; and
    exposing the plurality of vertical fins to a wet cleaning solution.

17. The method of claim 16, wherein the bracing segment is formed by selectively forming a protruding growth block on the exposed portions of the second dielectric material layer.

18. The method of claim 17, wherein the bracing segment is selectively formed using a selective atomic layer deposition process.

19. The method of claim 18, wherein the bracing segment is hafnium oxide.

20. The method of claim 19, further comprising removing the bracing segment using a selective isotropic etch.

* * * * *